United States Patent
Khusnatdinov et al.

(10) Patent No.: US 11,294,277 B2
(45) Date of Patent: Apr. 5, 2022

(54) PROCESS OF IMPRINTING A SUBSTRATE WITH FLUID CONTROL FEATURES

(71) Applicant: CANON KABUSHIKI KAISHA, Tokyo (JP)

(72) Inventors: Niyaz Khusnatdinov, Round Rock, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 199 days.

(21) Appl. No.: 16/045,401

(22) Filed: Jul. 25, 2018

(65) Prior Publication Data
US 2020/0033719 A1    Jan. 30, 2020

(51) Int. Cl.
| G03F 7/00 | (2006.01) |
| B29C 59/02 | (2006.01) |
| B82Y 40/00 | (2011.01) |
| B82Y 10/00 | (2011.01) |

(52) U.S. Cl.
CPC .......... *G03F 7/0002* (2013.01); *B29C 59/022* (2013.01); *B82Y 10/00* (2013.01); *B82Y 40/00* (2013.01)

(58) Field of Classification Search
CPC ..... G03F 7/0002; B29C 59/022; B82Y 10/00; B82Y 40/00
See application file for complete search history.

(56) References Cited

U.S. PATENT DOCUMENTS

| 6,936,194 B2 | 8/2005 | Watts |
| 7,157,036 B2 | 1/2007 | Choi et al. |
| 7,309,225 B2 | 12/2007 | McMackin et al. |
| 7,442,336 B2 * | 10/2008 | Choi ............... B82Y 10/00 264/319 |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 8,967,992 B2 | 3/2015 | Khusnatdinov et al. |
| 9,159,888 B2 | 10/2015 | Chitnis et al. |
| 9,278,857 B2 * | 3/2016 | Park ............... B29C 59/026 |
| 9,611,507 B2 | 4/2017 | Seul et al. |
| 10,035,296 B2 | 7/2018 | Ye et al. |
| 2018/0104888 A1 * | 4/2018 | Ye ............... B29C 59/026 |

OTHER PUBLICATIONS

Matthew Colburn, Byung Jin Choi, S.V. Sreenivasan, Roger T. Bonnecaze, C. Grant Willson, Ramifications of Lubrication Theory on Imprint Lithography, Microelectronic Engineering, Jun. 26, 2004, 75(3):321-329, Elsevier B.V., Amsterdam, NL, 2004.

(Continued)

*Primary Examiner* — Matthew J Daniels
*Assistant Examiner* — Shibin Liang
(74) *Attorney, Agent, or Firm* — Daniel Ratoff

(57) ABSTRACT

A process, system, and method of manufacturing an article on a substrate having a fluid control feature. The fluid control feature may include at least one depressed region formed along an edge of an imprint field. Formable material is deposited in the imprint field of the substrate. A template is moved such that the template comes into contact with the formable material in the imprint field. While the template comes into contact with the formable material, the formable material may flow into the fluid control feature.

20 Claims, 11 Drawing Sheets

(56) References Cited

OTHER PUBLICATIONS

Jun Huang, Bin Yan, Ali Faghihnejad, Haolan Xu, Hongbo Zeng, Understanding Nanorheology and Surface Forces of Confined Thin Films, Korea-Australia Rheology Journal, 26(1):pp. 3-14, Feb. 2014, Springer-Verlag, Berlin DE, 2014.

Igor V. Kuchin, Victor M. Starov, Hysteresis of the Contact Angle of a Meniscus inside a Capillary with Smooth, Homogeneous Solid Walls, Postprint, 2016, Loughborough University Institutional Repository, Loughborough, GB, 2016.

Xiaogan Liang, Hua Tan, Zengli Fu, Stephen Y. Chou, Air Bubble Formation and Dissolution In Dispensing Nanoimprint Lithography, Nanotechnology, Dec. 15, 2006, vol. 18, article 025303, pp. 1-7, Institute of Physics Publishing LTD., Bristol, GB, 2006.

Shravanthi Reddy, Roger T. Bonnecaze, Simulation of Fluid Flow in the Step and Flash Imprint Lithography Process, Microelectronic Engineering, Jul. 25, 2005, 82(1):60-70, Elsevier B.V, Amsterdam, NL, 2005.

H.A. Stone, A.D. Stroock, A. Ajdari, Engineering Flows in Small Devices: Microfluidics Toward a Lab-on-a-Chip, Annual Review of Fluid Mechanics, Jan. 21, 2004, 36:381-411, Annual Reviews, Palo Alto, CA, 2004.

Omid Arjmandi-Tash, Nina M. Kovalchuk, Anna Trybala, Igor V. Kuchin, Victor Starov, Kinetics of Wetting and Spreading of Droplets over Various, Substrates, Langmuir, Feb. 13, 2017, 33(18):4367-4385, American Chemical Society, Washington, DC, 2017.

Hayden Taylor, Simulation and Mitigation of Pattern and Process Dependencies in Nanoimprint Lithography, Journal of Photopolymer Science and Technology, Jan. 24, 2011, 24(1):47-55, The Society of Photopolymer Science and Technology, JP, 2011.

Willem-Jan A. de Wijs, Jozua Laven, Gijsbertus de With, Separations: Materials, Devices and Processes, Wetting Forces and Meniscus Pinning at Geometrical Edges, AIChE Journal, Jun. 9, 2016, 62 (12):4453-4465, Wiley Periodicals, Inc., Hoboken, NJ, 2016.

\* cited by examiner

PROCESS OF IMPRINTING A SUBSTRATE WITH FLUID CONTROL FEATURES

BACKGROUND

Field of Art

The present disclosure relates to systems and method of imprinting a pattern on a substrate.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

The template includes a patterning surface area on a mesa. The mesa is surrounded by a mesa sidewall. During the imprinting process formable fluid can seep out between the mesa and the substrate. As the formable fluid seeps out, the formable fluid can crawl up the template's mesa sidewall forming extrusions that can then, attach themselves to the mesa sidewall or form spikes on the imprint pattern edge. These extrusions and spikes can cause problems in subsequent processing steps. What is needed are systems and processes which prevent extrusions or spikes from forming and/or reduce the probability that these extrusions or spikes will form.

SUMMARY

At least a first embodiment, may be a process. The process may comprise providing a substrate having a fluid control feature. The fluid control feature may include at least one depressed region formed along an edge of an imprint field of the substrate. The process may further comprise depositing formable material in the imprint field of the substrate. The process may further comprise moving a template, such that the template comes into contact with the formable material in the imprint field. While the template comes into contact with the formable material, the formable material may flow into the fluid control feature.

In an aspect of the first embodiment, the fluid control feature surrounds the imprint field with the at least one depressed region.

In an aspect of the first embodiment, forming the fluid control feature includes etching at least one trench into the substrate.

In an aspect of the first embodiment, the trench may be etched into the substrate to a depth that is a height of features previously created in the imprint field.

In an aspect of the first embodiment, forming the fluid control feature may include coating both the trench and the imprint field with a film.

In an aspect of the first embodiment, forming the film may be spin coated on the substrate and then hardened.

In an aspect of the first embodiment, the substrate may be a wafer.

In an aspect of the first embodiment, the formable material has an outer meniscus that moves towards the edge of the imprint field, while the template is in contact with the formable material. The outer meniscus surrounds the formable material between the template and the substrate. The outer meniscus is an interface between the formable material, a surrounding gas, and between the template and the substrate closest to the edge of the imprint field. The outer meniscus has 1 dimensional curvature in the vertical direction between the template and substrate. A template contact line is an intersection of the template and the outer meniscus. A substrate contact line is an intersection of the substrate and the outer meniscus. A template side meniscus radius of curvature is a radius of the meniscus in the direction towards the substrate at the template contact line, averaged across the template contact line. A substrate side meniscus radius of curvature is a radius of the meniscus in the direction towards the template at the substrate contact line, averaged across the substrate contact line. Template side meniscus radius of curvature is less than the substrate side meniscus radius of curvature prior to template contact line reaching a template boundary.

An aspect of the first embodiment, may further comprise curing the formable material in the imprint field between the template and the substrate after the formable material has flowed into the fluid control feature.

In an aspect of the first embodiment, a mesa of the template may be larger than the imprint field, and the mesa overhangs the fluid control feature.

At least a second embodiment, may be an apparatus. The apparatus may comprise a substrate chuck configured to hold a substrate. The substrate may have a fluid control feature. The fluid control feature may include at least one depressed region formed along an edge of an imprint field of the substrate. The apparatus may further comprise a fluid dispenser configured to deposit formable material in the imprint field of the substrate. The apparatus may further comprise a template chuck configured to hold a template. The apparatus may further comprise a positioning system configured to move the template chuck and the substrate chuck relative to each other, such that the template comes into contact with the formable material in the imprint field. While the template comes into contact with the formable material, the formable material may flow into the fluid control feature on the substrate.

In an aspect of the second embodiment, the fluid control feature may surround the imprint field with the at least one depressed region.

In an aspect of the second embodiment, forming the fluid control feature may include etching at least one trench into the substrate.

In an aspect of the second embodiment, forming the fluid control feature may include coating both the trench and the imprint field with a film.

In an aspect of the second embodiment, the film may be spin coated on the substrate and then hardened.

In an aspect of the second embodiment, the substrate may be a wafer.

In an aspect of the second embodiment, the formable material has an outer meniscus that moves towards the edge of the imprint field, while the template is in contact with the formable material. The outer meniscus surrounds the formable material between the template and the substrate. The outer meniscus is an interface between the formable material, a surrounding gas, and between the template and the mesa closest to the edge of the imprint field. The outer meniscus has 1 dimensional curvature in the vertical direction between the template and substrate. A template contact line is an intersection of the template and the outer meniscus. A substrate contact line is an intersection of the substrate and the outer meniscus. A template side meniscus radius of curvature is a radius of the meniscus in the direction towards the substrate at the template contact line, averaged across the template contact line. A substrate side meniscus radius of curvature is a radius of the meniscus in the direction towards the template at the substrate contact line, averaged across the substrate contact line. Template side meniscus radius of curvature may be less than the substrate side meniscus radius of curvature prior to template contact line reaching a template boundary.

An aspect of the second embodiment, may further comprise a curing system configured to cure the formable material in the imprint field between the template and the substrate after the formable material has flowed into the fluid control feature.

In an aspect of the second embodiment, a mesa of the template may be larger than the imprint field, and the mesa overhangs the fluid control feature.

At least a third embodiment, may be a method of manufacturing an article. The method of manufacturing may comprise providing a substrate having a fluid control feature. The fluid control feature may include at least one depressed region formed along an edge of an imprint field of the substrate. The method of manufacturing the article may further comprise depositing formable material in the imprint field of the substrate. The method of manufacturing the article may further comprise moving a template, such that the template comes into contact with the formable material in the imprint field among the plurality of imprint fields of the substrate. While the template comes into contact with the formable material, the formable material may flow into the fluid control feature. The method of manufacturing the article may further comprise perform additional processing on the substrate so as to manufacture the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
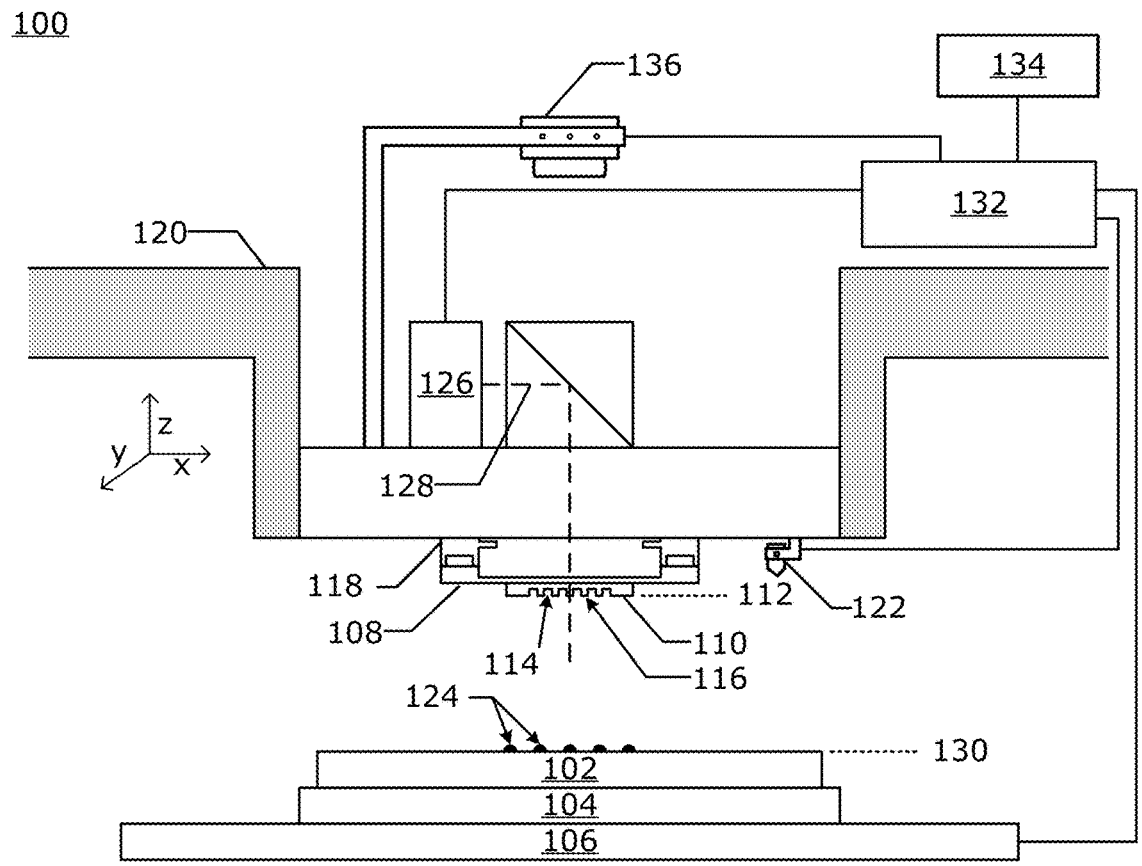
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a system and/or method that prevents extrusions from forming on the sidewalls or removing extrusions from sidewalls while protecting the pretreated patterning surface. Nanoimprint System FIG. 1 is an illustration of a nanoimprint lithography system 100 in which an embodiment may be implemented. The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102. The mesa 110 may have a patterning surface 112 thereon. Alternatively, the template 108 may be formed without the mesa 110, in which case the surface of the template facing the substrate 102 is equivalent to the mold 110 and the patterning surface 112 is that surface of the template 108 facing the substrate 102.

The template 108 and/or the mold 110 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 comprises features defined by a plurality of spaced-apart template recesses 114 and/or template protrusions 116, though embodiments of the present invention are not limited to such configurations (e.g., planar surface). The patterning surface 112 defines a pattern that forms the basis of a pattern to be formed on the substrate 102. In an alternative embodiment, the patterning surface 112 is featureless in which case a planar surface is formed on the substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may be coupled to an imprint head which in turn may be moveably coupled to a bridge 120 such that the template chuck 118, the imprint head, and the template 108 are moveable in at least the z-axis direction, and potentially other directions (e.g. x, y, θ, and φ-axes). The positioning system may include one or more motors which move template 108.

Nanoimprint lithography system 100 may further comprise a fluid dispenser 122. The fluid dispenser 122 may also be moveably coupled to the bridge. In an embodiment, the fluid dispenser 122 and the template chuck 120 share one or more positioning components. In an alternative embodiment, the fluid dispenser 122 and the template chuck 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, and piezoelectric ink jetting are common techniques for dispensing jettable liquids.

The nanoimprint lithography system 100 may further comprise an energy source 126 that directs actinic energy along an exposure path 128. The Imprint head and the substrate positioning stage 106 may be configured to position the template 108 and the substrate 102 in superimposition with the exposure path 128. A camera 136 may likewise be positioned such that an imaging field of the camera 128 is in superimposition with the exposure path 128.

The nanoimprint lithography system 100 may be regulated, controlled and/or directed by one or more processors 132 (controller) in communication with one or more components and/or subsystems such as the substrate positioning stage 106, the imprint head, the fluid dispenser 122, the source 126, and/or the camera 136 and may operate based on instructions in a computer readable program stored in a non-transitory computer readable memory 134. The processor 132 may be or include one or more of a CPU, MPU, GPU, ASIC, FPGA, DSP, and a general purpose computer. The processor 132 may be a purpose built controller or may be a general purpose computing device that is adapted to be a controller. Examples of a non-transitory computer readable memory includes but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head, the substrate positioning stage 106, or both varies a distance between the mold 110 and the substrate 102 to define a desired volume that is filled by the formable material 124. For example, the imprint head may apply a force to the template 108 such that mold 110 is in contact with the formable material 124. After the desired volume is filled with the formable material 124, the source 126 produces energy, e.g., actinic radiation (UV), causing formable material 124 to cure, solidify, and/or cross-link conforming to a shape of the substrate surface 130 and the patterning surface 112, defining a patterned layer on the substrate 102. The formable material 124 is cured while the template 108 is in contact with formable material 124 forming the patterned layer on the substrate 102. Thus the nanoimprint lithography system 100 uses an imprinting process to form the patterned layer which has recesses and protrusions which are an inverse of the pattern in the patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) above a highest point on the substrate surface 130 in each imprint field. The patterned layer may also include one or more features such as protrusions which extend above the residual layer having a thickness. These protrusions match the recesses 114 in the mesa 110.

Template

Figure 2:
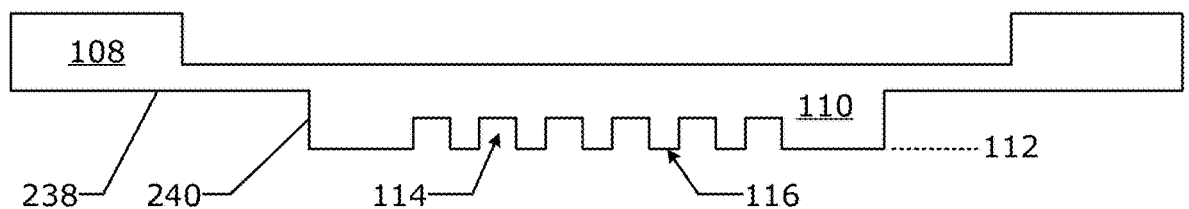
FIG. 2 is an illustration of an exemplary template as used in an embodiment.

FIG. 2 is an illustration of a template 108 that may be used in an embodiment. The patterning surface 112 is on a mesa 110. The mesa 110 is surrounded by a recessed surface 238. Mesa sidewalls 240 connect the recessed surface 238 to a top surface of the mesa 110. The mesa sidewalls 240 surround the mesa 110. In an embodiment in which the mesa is round or has rounded corners, the mesa sidewalls refers to a single mesa sidewall that is a continuous wall without corners.

Imprinting Process

Figure 3:
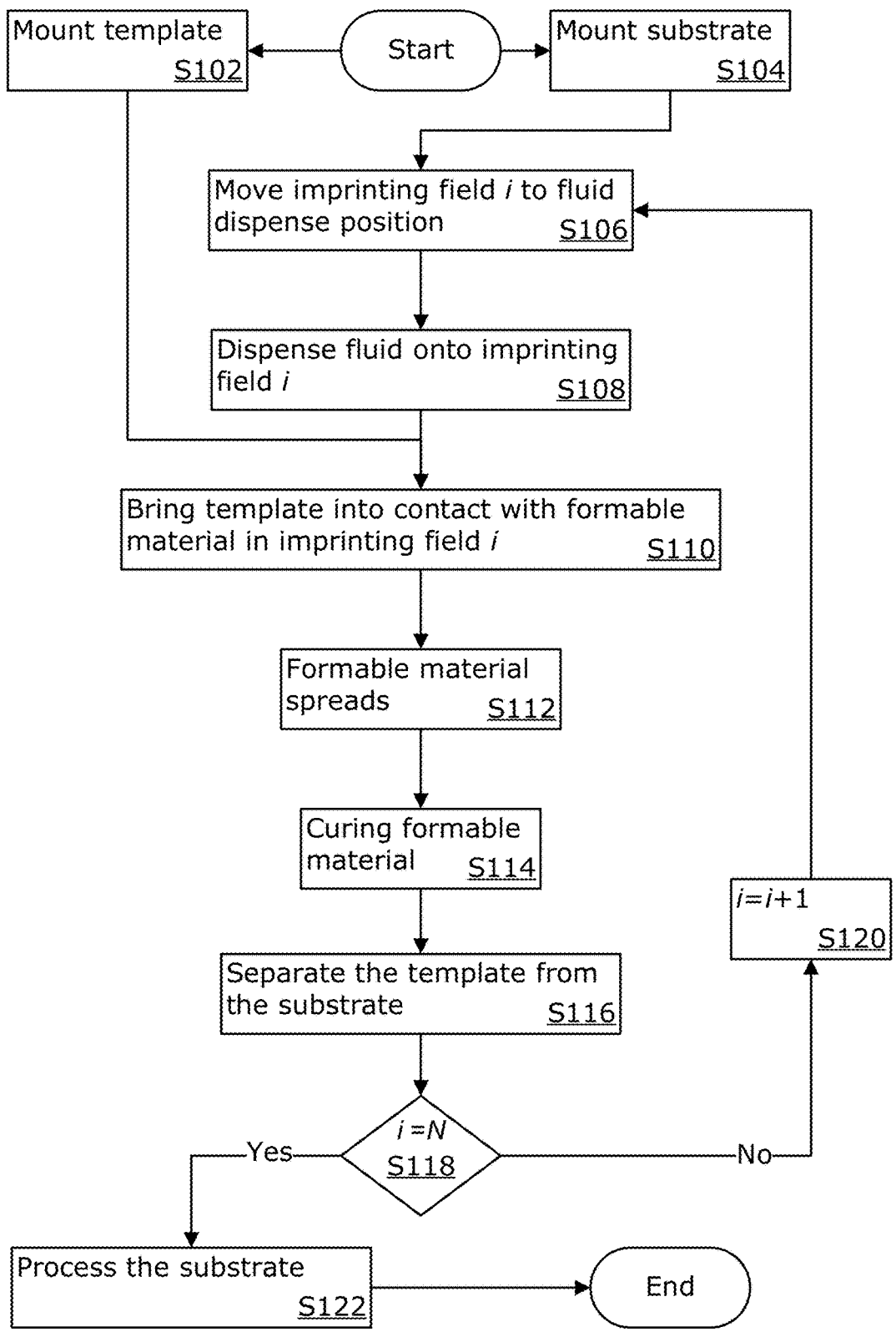
FIG. 3 is an illustration of an exemplary imprinting method as used in an embodiment.

FIG. 3 is a flowchart of an imprinting process 300 by the nanoimprint lithography system 100 that can be used to form patterns of a formable material 124 on a plurality of substrate-side imprint fields (also referred to as: pattern areas or shot areas). The imprinting process 300 may be performed repeatedly on a plurality of substrates 11 by the nanoimprint lithography system 100. The processor 132 may be used to control imprinting process 300.

The beginning of the imprinting process may include a step S102 of the processor 132 causing a template conveyance mechanism to mount a template on the template chuck 118. In a step S104, the processor 132 causes a substrate conveyance mechanism to mount the substrate 102 on the substrate chuck 104. The order in which the template 108 and the substrate 102 are mounted onto the nanoimprint lithography system 100 imprint apparatus is not particularly limited, and the template 108 and the substrate 102 may be mounted sequentially or simultaneously.

In a positioning step S106, the processor 132 may cause one or both of the substrate positioning stage 106 and a template positioning stage (not shown) to an imprinting field i (index i may be initially set to 1) to a fluid dispense position below the fluid dispenser 122. The substrate 102, may be divided into N imprinting fields, wherein each imprinting field is identified by an index i. In a dispensing step S108, the processor 132 may cause the fluid dispenser 122 to dispense formable material onto imprinting field i. In an embodiment, the fluid dispenser 122 dispenses the formable material 124 as a plurality of droplets. In a contacting step S110, the processor 132 may cause one or both of the substrate positioning stage 106 and a template positioning stage to bring the patterning surface 112 of the template 108 into contact with the formable material 122 in imprinting field i.

During a spreading step S112, the formable material 124 then spreads out towards the edge of the imprinting field i. The edge of the imprinting field may be defined by the edges of the mesa 110 of the template 108. How the formable material 124 spreads and fills the mesa can be observed via camera 136. At a specified time after step S110 or after formable material 124 has spread to a specified extent in step S112, the processor 132 causes the energy source 126 to irradiate the formable material 124 with actinic radiation, in step S114, so as to cure (polymerize) the formable material 124. In a step S116, the processor 132 uses one or both of the substrate positioning stage 106 and a template positioning stage to separate the patterning surface 112 of the template 108 from the cured formable material on the substrate 102.

In a step S118, the processor 132 checks if the index i is equal to N. If the index i is not N then the process 300 moves onto an incrementing step S120 in which the index i is incremented and the process 300 moves back to step S106. If the index i is N then the imprinting process 300 stops. In one embodiment, additional processing is performed on the substrate 102 in a step S122 so as to create an article of manufacture (semiconductor device). In an embodiment, each imprinting field includes a plurality of devices.

The further processing in step S122 may include etching processes to transfer a relief image into the substrate that corresponds to the pattern in the patterned layer. The further processing in step S122 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Spreading Beyond the Mesa Edge

Figure 4A:
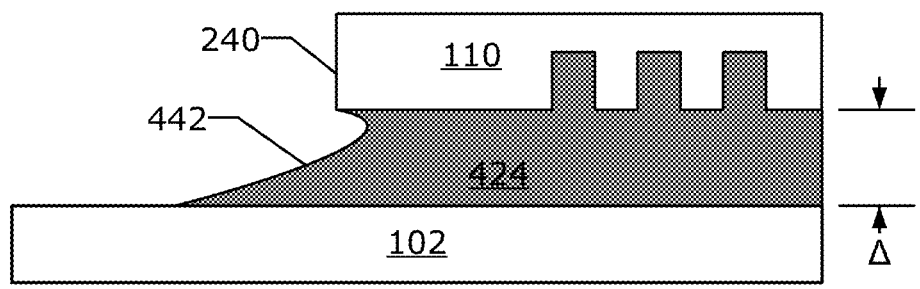
FIGS. 4A-C are illustrations of the flow of formable material beyond an imprint field.

The mesa boundary of the template 108 is defined by the mesa sidewalls 240. The mesa boundary may be formed using optical lithography with a subsequent etching step. A typical height of the mesa sidewalls is around 50 μm. During step S112 as the formable material 124 creates a liquid film 424. The liquid film 424 may spread beyond the mesa sidewalls 240 as illustrated in FIG. 4A. The liquid film 424 has a meniscus 442 between the mesa 110 and the substrate 102. The meniscus 424 can extend beyond the mesa boundary (edge of imprint field) as illustrated in FIG. 4A. Once the formable material reaches the mesa edge the gap thickness increases from between 10 nm-100 nm to up to 50 μm significantly decreases the driving capillary force. The capillary force pushing formable material out of the gap between the mesa and the substrate significantly reduces as the capillary gap increases.

$$P_1 - P_0 = \gamma \cdot \left( \frac{1}{R_x} + \frac{1}{R_y} \right) \tag{1}$$

Equation (1) above describes the capillary pressure for small symmetric contact angles where $P_1$ is the pressure inside the liquid film 424, $P_0$ is the air pressure; $R_x$ is radius of curvature along a first linear dimension of the meniscus 442; $R_y$ is the radius of curvature along the second linear dimension of the meniscus 442. In the present disclosure, our consideration the second linear dimension is perpendicular to the plane of FIG. 4A. Considering the long sides along the mesa sidewall, $R_y$ is very large and the Equation (1) simplifies to equation (2) below.

$$P_1 - P_0 = \frac{\gamma}{R_x} \tag{2}$$

In an embodiment, the gap Δ between the mesa 110 and the substrate 102, if the contact angles are equal, also defines the diameter of the meniscus 442 as described in equation (3). Where $D_x$ is the meniscus diameter when it is far enough from the mesa edge. The pressure inside formable material $P_1$ and the meniscus curvature $R_x$ are related to each other as the atmospheric pressure of air is considered fixed.

$$\Delta = D_x = 2R_x \tag{3}$$

During step S112 an extrusion may form due to the following reasons. The capillary slit formed by the gap between the mesa 110 and substrate 102 terminates at the mesa boundary. This sets the final volume of the capillary available for the formable material. If the gap is not large enough to accommodate all of the formable material between the mesa 110 and the substrate 102 then the excess formable material will seep out. The targeted formable material residual layer, the residual layer thickness variations, and the imprint force distribution along the mesa surface can be considered to ensure that there is no excess formable material. Even if there is no excess formable material, some of formable material can leak out through accidental wetting of the mesa sidewalls. The specific mechanisms can vary but can include: evaporation and condensation of some formable material components onto the mesa sidewalls near the mesa edge; mechanical vibration of the mesa; scratches on the mesa sidewalls; cracks in the mesa sidewalls; etc.

In an embodiment, the formable material 124 may wet the substrate 102 better than template 108. For example the formable material 124 wetting angle on substrate may be ~0.5° while the wetting angle on the template side is more than 7°. Thus the capillary meniscus formed between the template and the substrate has a highly asymmetric shape where the formable material spreads a further distance along the substrate surface. Equation (3) can be modified to take into account these differing wetting angles as described by equation (4) below. Where $z_{template}$ and $z_{substrate}$ are the corresponding surface heights of the mesa and substrate along vertical z-axis.

$$P_1 - P_0 = \gamma \frac{\gamma}{(z_{template} - z_{substrate})} \int_{z_{substrate}}^{z_{template}} \frac{1}{R_x(z)} dz \quad (4)$$

The function $R_x(z)$ is representative of the outer meniscus that moves towards the edge of the imprint field, while the template is in contact with the formable material. The outer meniscus surrounds the formable material between the template and the substrate. The outer meniscus is an interface between the formable material, a surrounding gas, and between the template and the mesa closest to the edge of the imprint field. The outer meniscus has 1 dimensional curvature in the vertical direction between the template and substrate. A template contact line, $z_{template}$, is an intersection of the template and the outer meniscus. A substrate contact line, $z_{substrate}$ is an intersection of the substrate and the outer meniscus. A template side meniscus radius of curvature is a radius of the meniscus in the direction towards the substrate at the template contact line, averaged across the template contact line. A substrate side meniscus radius of curvature is a radius of the meniscus in the direction towards the template at the substrate contact line, averaged across the substrate contact line. Template side meniscus radius of curvature is less than the substrate side meniscus radius of curvature prior to template contact line reaching a template boundary as described by equation (4a) below. Note that the contour integrals in equation (4a) are along the outer meniscus parallel to the template and substrate that encircles the formable material.

$$\frac{\oint_{z_{template}} R_x(z_{template}, y) dy}{\oint_{z_{template}} dy} < \frac{\oint_{z_{substrate}} R_x(z_{substrate}, y) dy}{\oint_{z_{substrate}} dy} \quad (4a)$$

Figure 4B:
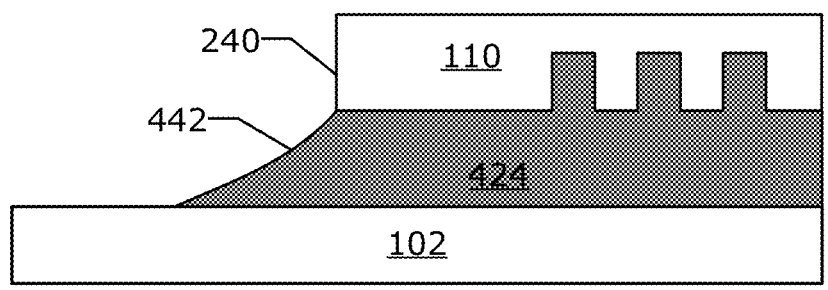
Figure 4C:
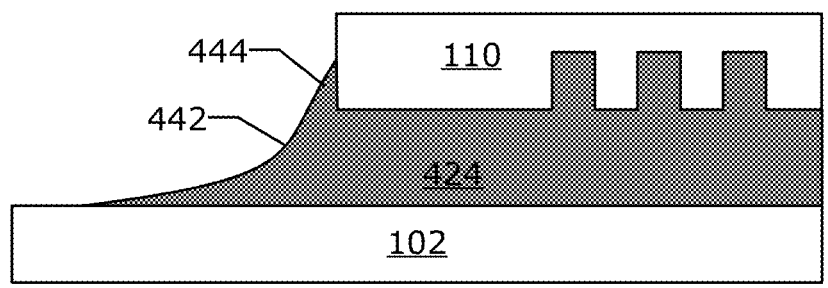

When the formable material reaches the mesa edge the leading edge along the substrate can go beyond the imprint field defined by the mesa sidewalls by up to a few micrometers. This disparity in driving forces along the two surfaces, formable material volume mismatch, and excessive imprint force eventually can cause the formable material to seep out of the imprint field mesa area into the sloped area outside of the flat one. The meniscus angle at the mesa sidewall flips 90 degrees as it negotiates the corner of the template's mesa sidewall as illustrated in FIGS. 4A-C. FIG. 4B is an illustration of the fluid front of the formable material as it reaches the edge of the mesa sidewall 240 and when meniscus is stable and pinned by the corner of the mesa sidewall.

As illustrated in FIG. 4C, the formable material 424 may start to wet the mesa edge 240 and move up the mesa sidewall 240 forming an extrusion 444. Once the mesa sidewall 240 has been wetted by formable material, the formable material will start to creep up the mesa sidewall every time an imprint is made with that template. Imprint after imprint the formable material leak area expands as the imprint process continues. Eventually the formable material on the mesa edge can be cured or partially cured. At some point the cured formable material separates from the template and forms an extrusion on the substrate. The extrusion may be higher than other formable material features on the substrate.

Such extrusions can create problems for subsequent spin-on coatings and imprinting. They even can create problems for optical lithography as the extrusions can be very tall.

Figure 5A:
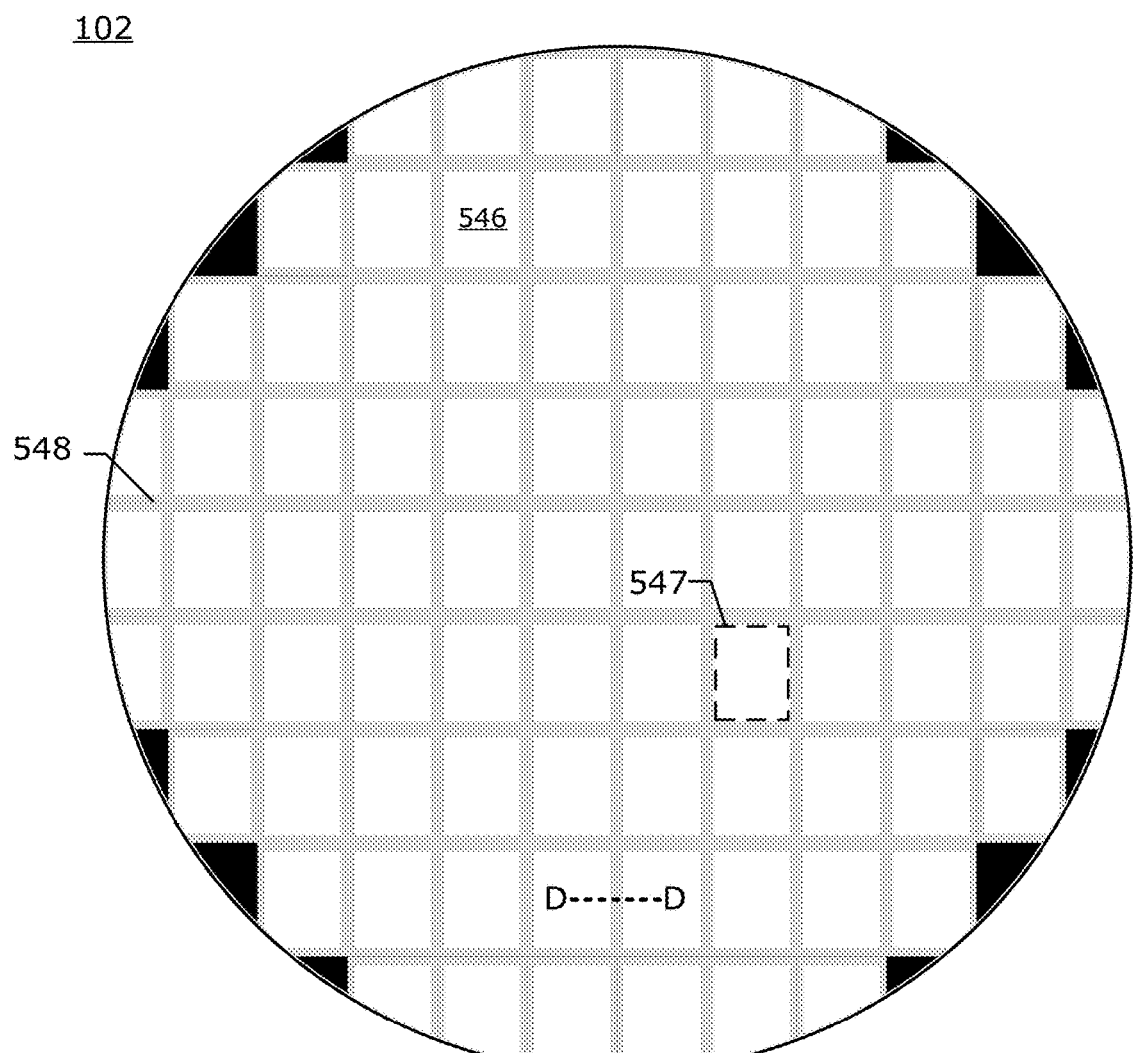
FIGS. 5A-B are illustrations of an exemplary substrate as used in an embodiment.
Figure 5B:
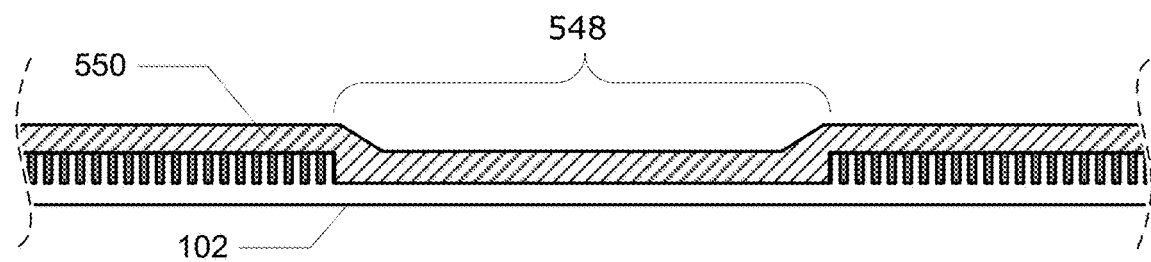

FIG. 5A is an illustration of a substrate 102 that is divided into N imprint fields 546. The imprint fields are illustrated as white regions in FIG. 5A. An exemplary imprint field edge 547 is illustrated as a dashed line in FIG. 5A. The imprint field edge 547 (edge of imprint field) may take a square, rectangular, circle, or other shape and may be defined by an edge of a template, edge, of a mesa, or an edge of a pattern region of the template. In an embodiment, the edge of a template may be curved. In between each imprint field there are gaps 548. The gaps 548 are illustrated as grey regions in FIG. 5A. The gaps on the substrate 102 prior to imprinting may be in the same plane as the imprinting field or higher than the imprinting field. The applicant has found that when the gaps are higher than the imprinting field this can create issues for the imprinting process. The applicant has found that when the gaps 516 are below imprinting field as illustrated in FIG. 5B this can improve the imprinting process 300. FIG. 5B is an illustration of a cross-section D-D of the substrate in FIG. 5A.

FIG. 5B is an illustration of a substrate with a zero height gaps 548 with depression formed in a subsequent spin-on planarization layer 550. The depression is formed along the edges of the imprint field of the substrate. The depression may run parallel to the edges of the imprint field. The gap 548 may be formed using optical lithography of a spun on resist to define the spatial extent of the gaps and an etching step to define the depth of the gaps 548. This depression in gaps 548 of the planarization layer 550 formed at the edges of the imprint fields 546 allows for better extrusion control due to expanded capillary gap between the template and the substrate, which reduces the driving capillary force. Moreover, the applicant has found that when the formable material does leak out into the depressed gap, extrusions are less likely to form.

The width of the gap 548 may lies in the range from 4 μm to 50 μm. The substrate 102 may be a featureless substrate, in which the imprinting process 300 is the first patterning step. In which case, a micron scale lithography step may be used to form the gaps using a stepper or whole wafer lithography. In an embodiment, the substrate 102 already has previous features formed in the imprinting field, in which the gaps 548 may be formed at the same time that the previous imprinting field features are formed. In an embodiment, the gaps 548 between imprint fields may be incorporated into the pattern of the imprint field. Each imprint field may include multiple dies, between each die may be a kerf, which is distinct from the gaps between the imprint fields.

Figure 6A:
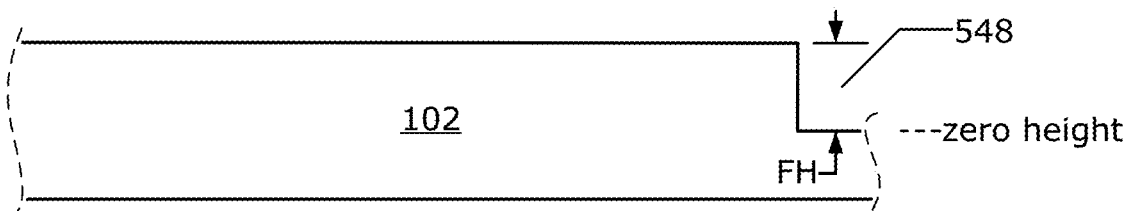
FIGS. 6A-E are illustrations of exemplary substrates and template as used in an embodiment.
Figure 6B:
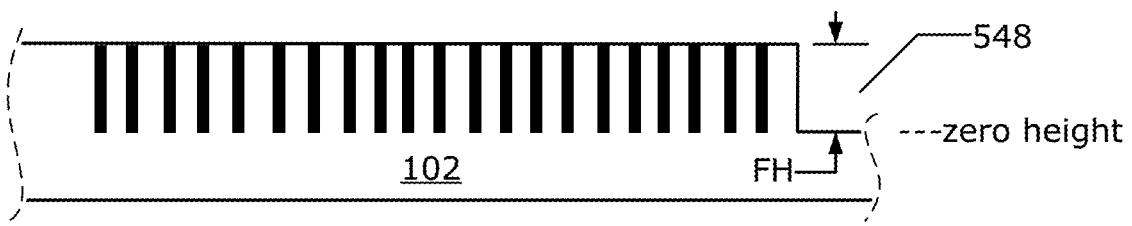

FIG. 6A is an illustration of a portion of a substrate with a full height (FH) gap 548 forming a zero height gap. The original imprint field gaps are exposed to allow etching to the full feature depth, and thus forming a zero height level. FIG. 6B is an illustration of a patterned imprint field 546 and an adjacent gap 548 in which the gap is at the same depth of the features in the imprint field.

FIG. 6A is an illustration of a substrate 102 with a featureless field edge, and with a zero height gap 548. FIG. 6B is an example of a substrate 102 that includes features in the imprinting field. The features of the imprinting field may have a height that range from less than 1 nm to 100 nm. For example the feature height may be 60 nm.

Figure 6C:
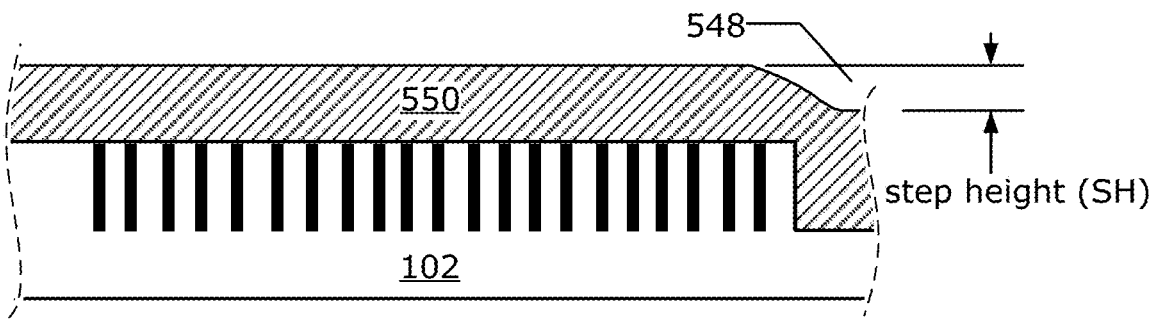

In between lithography patterning steps the substrate may be planarized, for example with a spin-on planarization layer 550 as illustrated in FIG. 6C. The planarity of the spin-on planarization layer 550 depends on feature sizes, spacing, and height of the underlying features. The applicant has found that, that the gaps 548 between imprint fields 546 tend not to be well planarized relative to the planarity of the imprint field 546. The applicant has found that a zero height gap can create a dip with a step height (SH) in the planarization layer 550.

Equation (8) below describes how the film thickness (FT) of the planarization layer 550 above the imprint field can be estimated based on the fill factor (FF) of features in the imprint field. In which a reference film thickness ($FT_0$) is the film thickness on a blank substrate (FF=0).

$$FT=FT_0-FH\cdot FF \qquad (5)$$

The applicant has found that in order to coat a substrate uniformly the spin-on layer thickness on a blank substrate, $FT_0$, should be larger than the value obtained by multiplication of the feature height, FH, and the fill factor, FF. For example, if we take fill pattern with an etch depth of 60 nm, and with a fill factor of 50% we estimate the minimum thickness of the spin-on planarization layer as 30 nm in the imprint field.

The applicant has found that height variations in the planarization film due to a zero height gap happen within approximately ±2 μm of a spatial window centered on the substrate step from the imprint plane to the plane of the gap. The extent of this spatial window is near independent of the film thickness $FT_0$. The applicant has found that for gaps 548 described in this disclosure, thicknesses of the planarization film in the gap is $FT_0$, in the range of less than 1 nm to 300 nm.

Equation (6) below describes how to estimate the step height (SH) illustrated in FIG. 6C, of the planarization film. For example the step is half of the FH for a field with 50% fill pattern.

$$SH=FH\cdot(1-FF) \qquad (6)$$

Figure 6D:
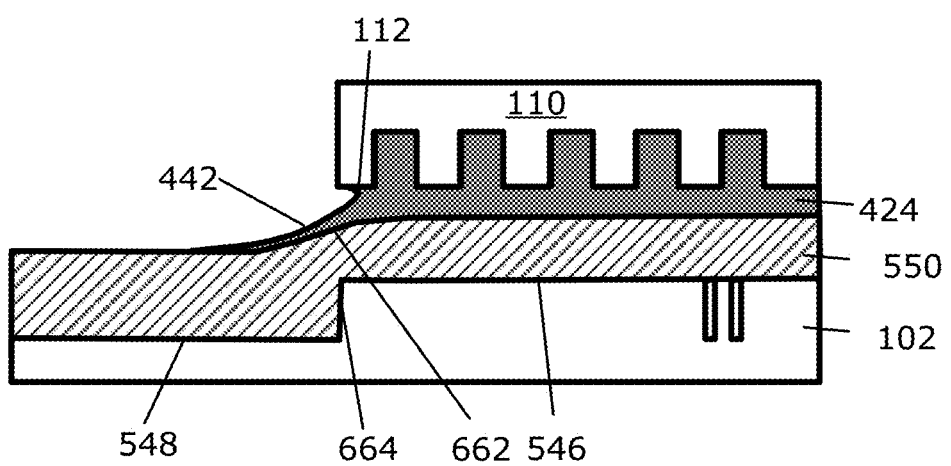

FIG. 6D is an illustration of formable material being imprinted with a template on a substrate with a zero height gap. A spin-on planarization layer 550 is formed on a substrate 102. The substrate 102 shape may be produced by a previous lithography step. After the planarization step, the spin-on layer shows a dip 662. The original substrate step 664 between zero height gap 548 and the imprint field 546 has a height equal to the imprint field feature 668 height.

FIG. 6D illustrates the meniscus 442 of the formable material between the sloped surface of the dip 662 and the patterning surface 112 of the mesa 110. FIG. 6D illustrates the formable material flowing into the fluid control feature (dip 662) while the template is in contact with formable material. The depth SH of the dip 662 in the planarization spin-on layer is defined by equation (6) above.

Figure 6E:
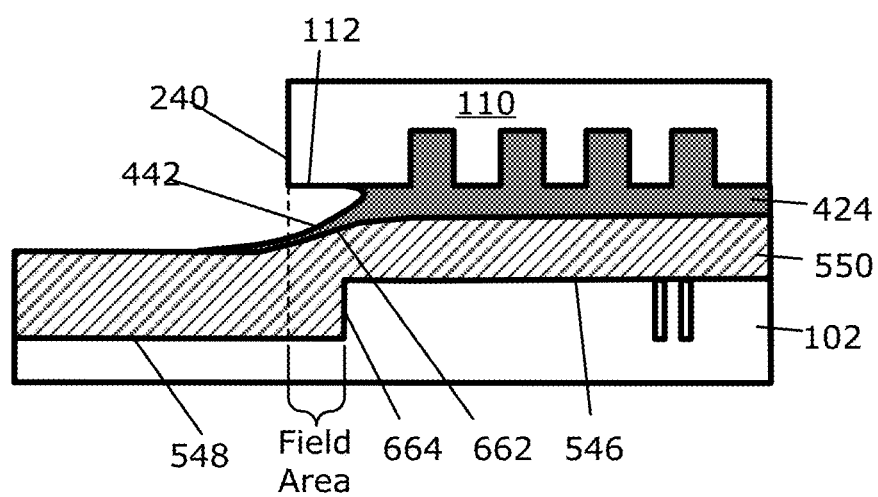

FIG. 6E is an illustration of formable material being imprinted with a template 108 on a substrate 102 with a zero height gap 548. A spin-on planarization layer 550 is formed on a substrate 102. The substrate 102 shape may be produced by a previous lithography step. After the planarization step, the spin-on layer shows a dip 662. The original substrate step 664 between zero height gap 548 and the imprint field 546 has a height equal to the imprint field feature 668 height. In an embodiment, illustrated in FIG. 6E, a mesa 110 is larger than the imprinting field 546 and overhangs the dip 664 in the substrate 102. The mesa sidewall 240 overhangs the dip 664. Thus the dip is moved inward a field area of an equilibrium meniscus position also shifts inward. Such a shift allows further reduction of the probability of extrusion formation. A distance between the liquid formable material meniscus and the mesa edge has increased.

Figure 7A:
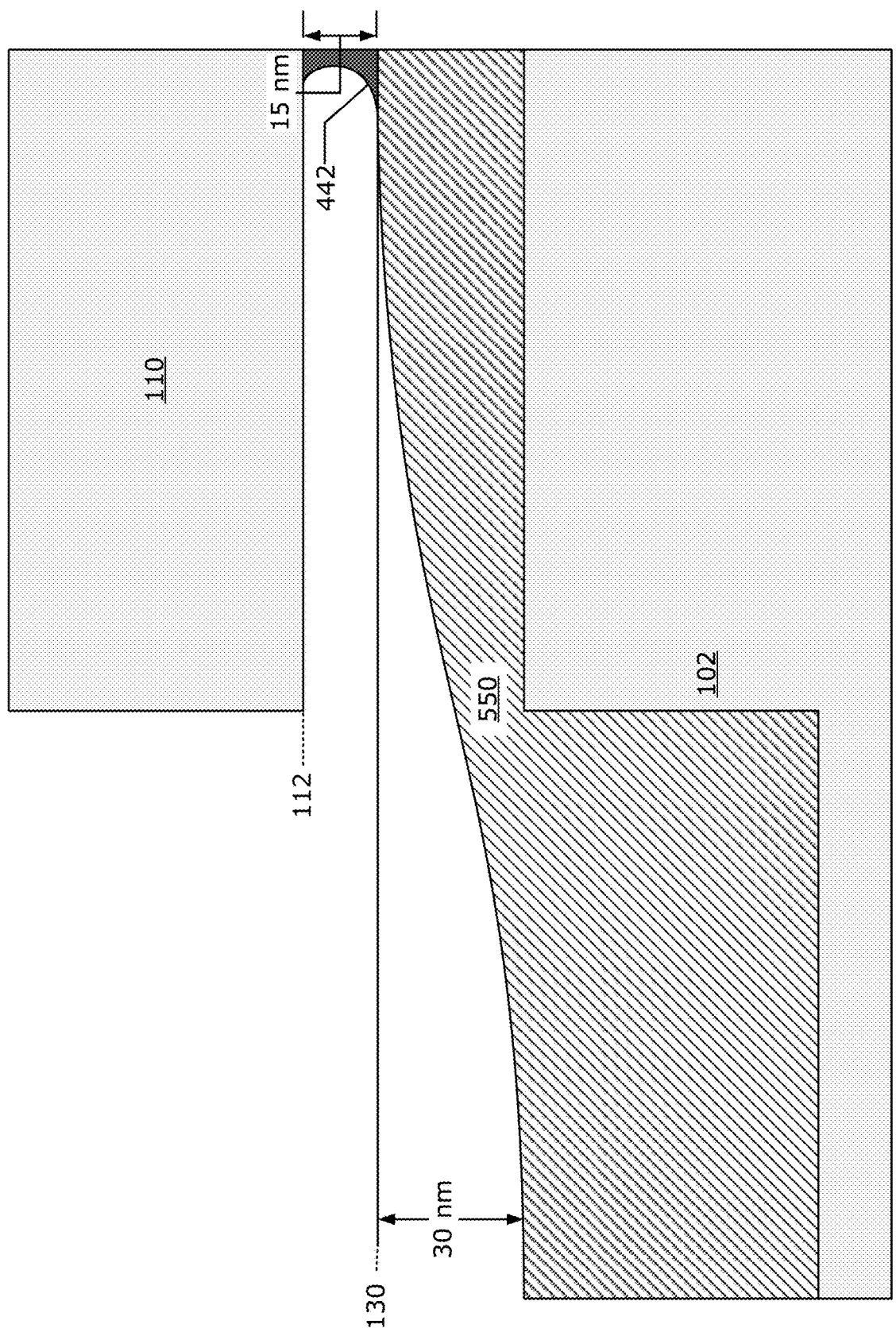
FIGS. 7A-E are illustrations of the flow of formable material in an embodiment.
Figure 7B:
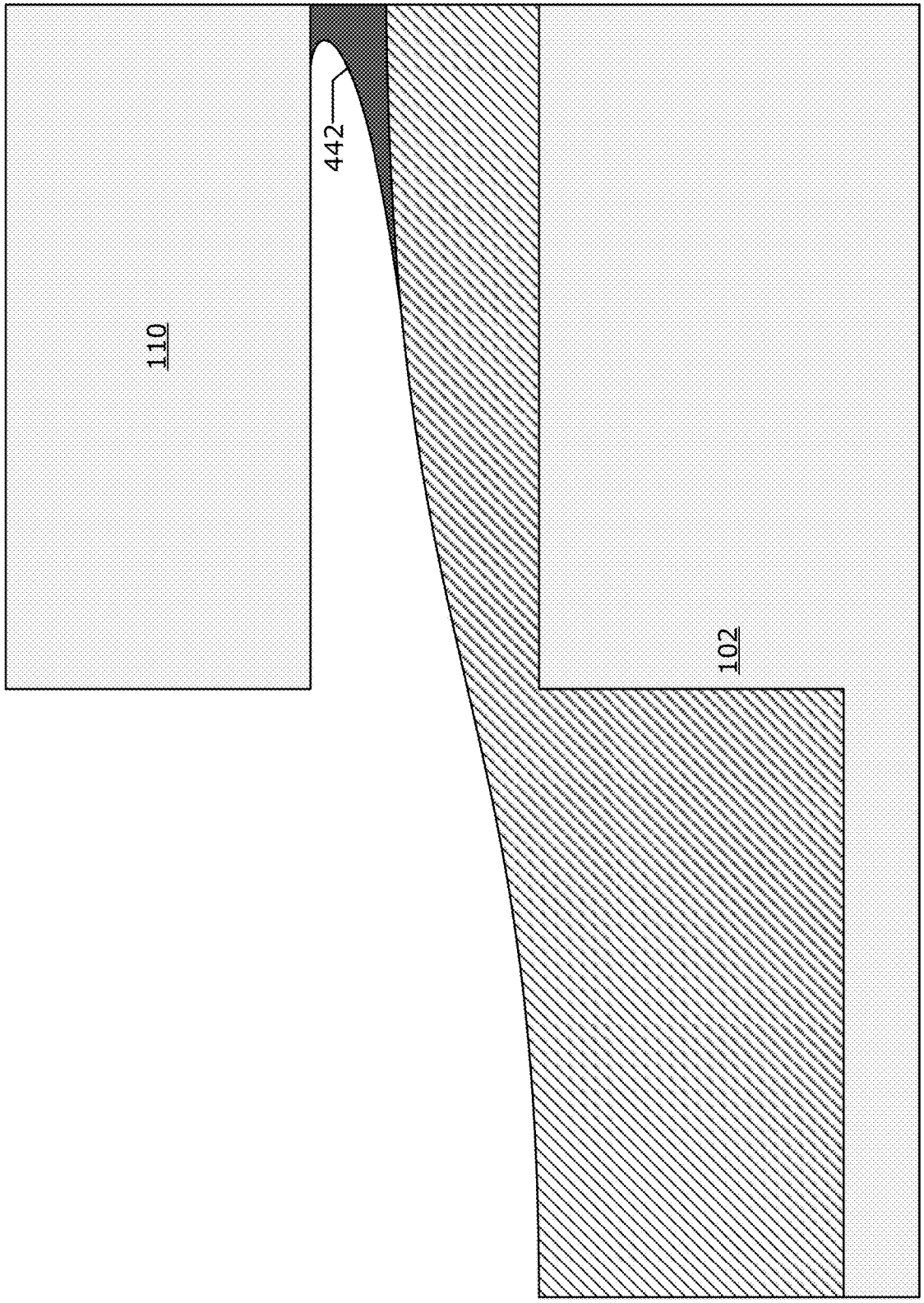
Figure 7C:
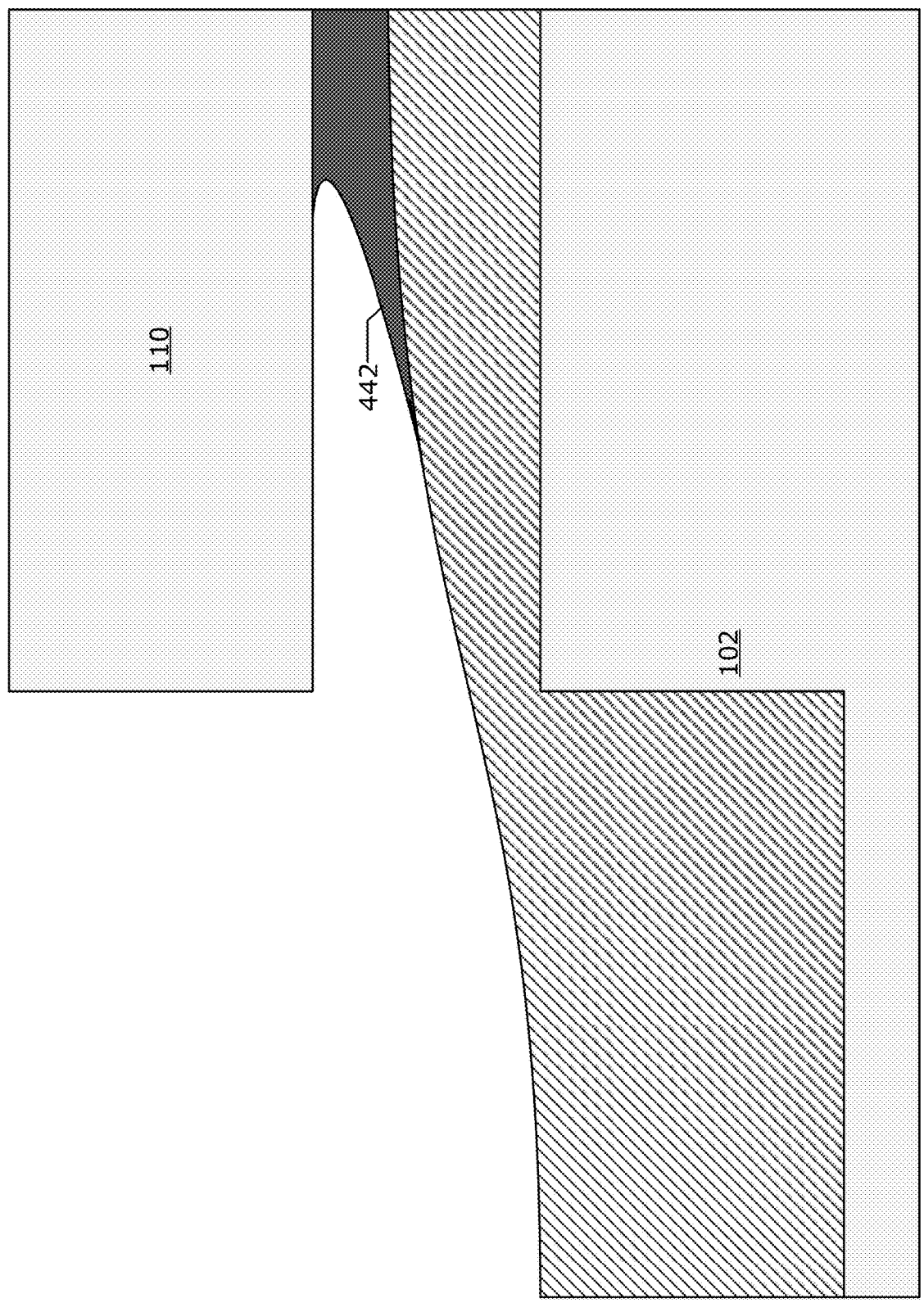
Figure 7D:
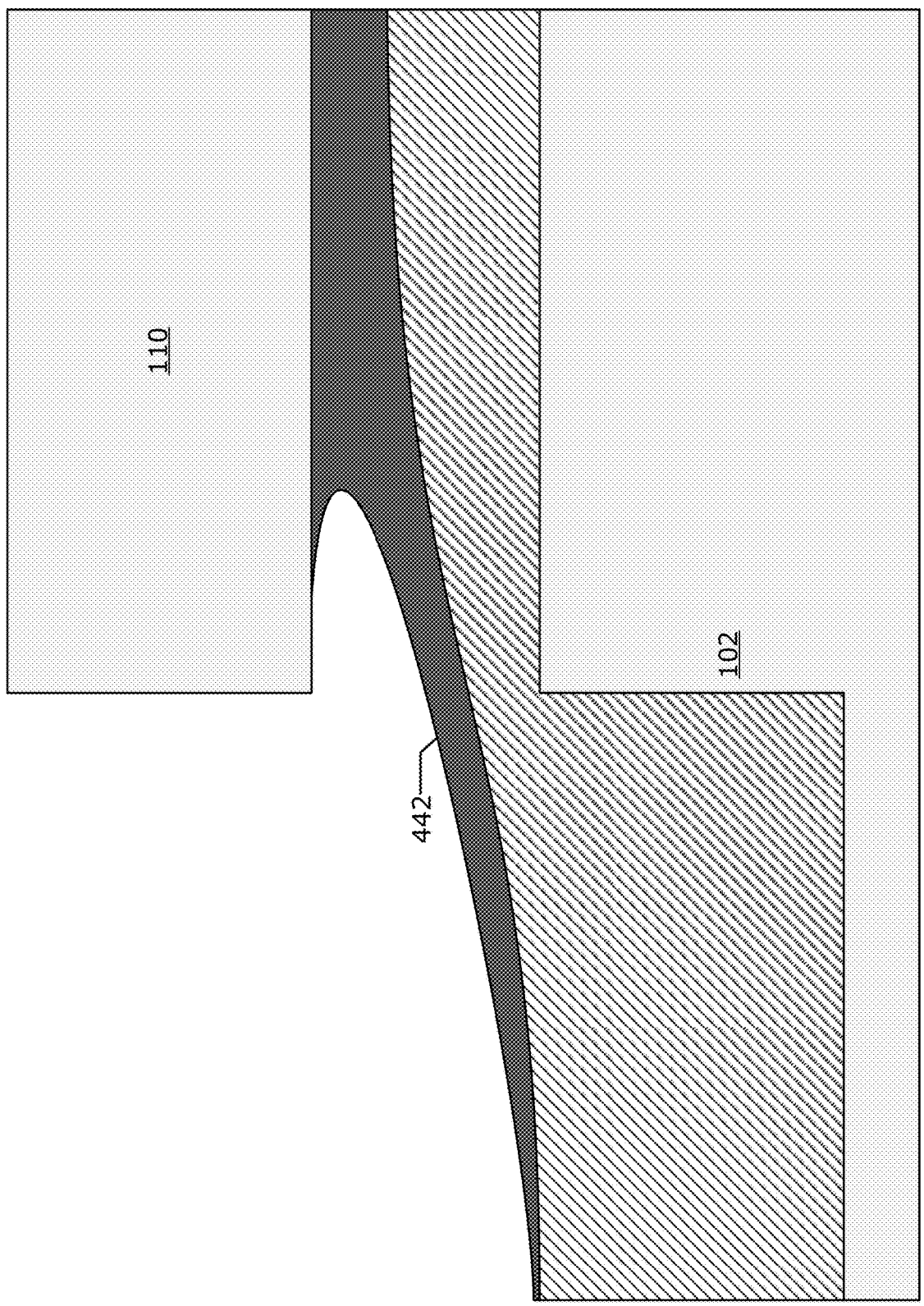
Figure 7E:
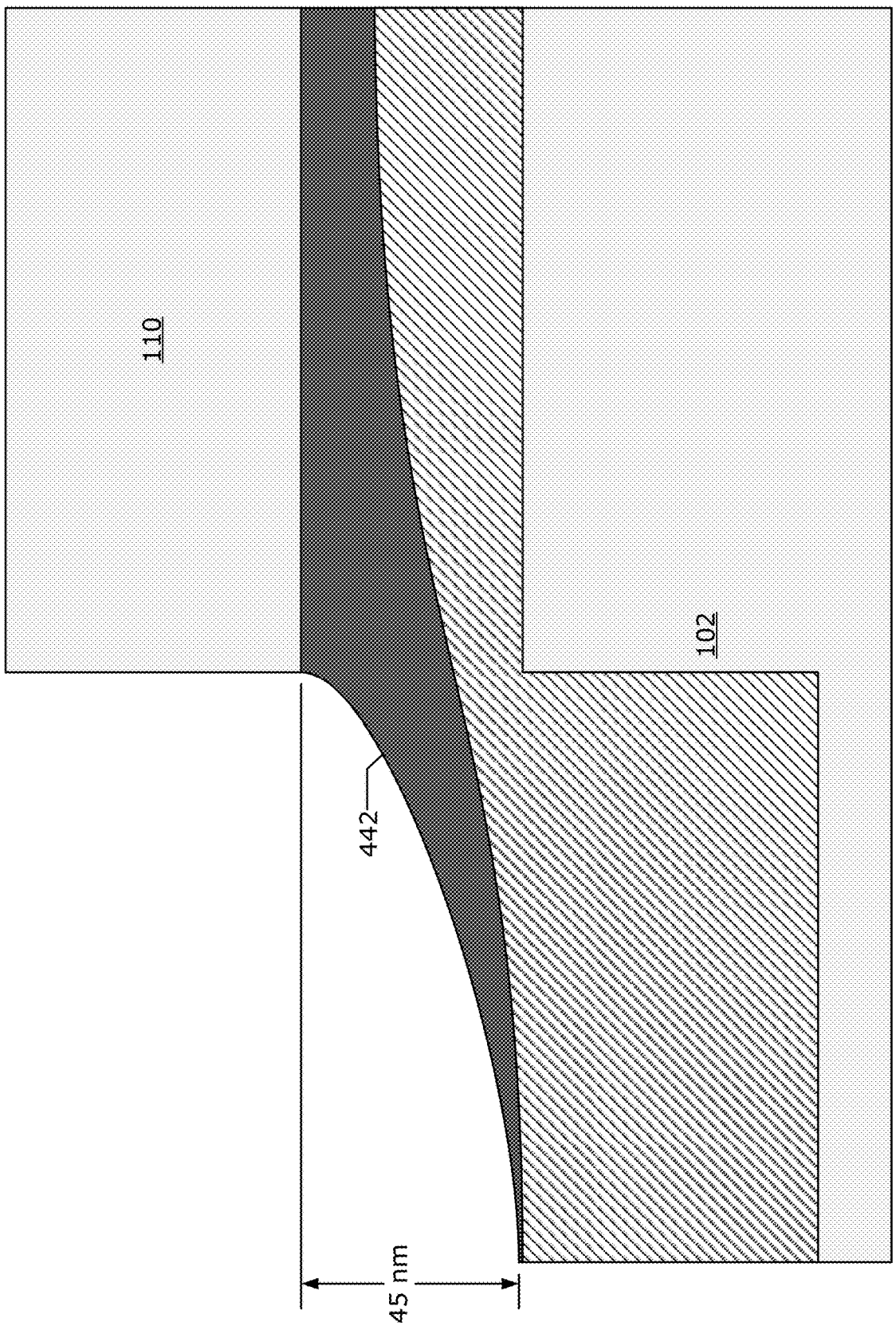

The height of the meniscus is larger due to the gap by the step height, SH in the planarization layer. For instance, the gap originally defined by the 15 nm residual layer thickness between the patterning surface 112 and the substrate surface 130 is increased by 30 nm SH as is illustrated in FIG. 7A. An outer meniscus 442 is initially 15 nm in size. The outer meniscus is asymmetric due to the difference in contact angles on the template and substrate sides. The shape of the meniscus becomes even more asymmetric due to the effect of formable material draining into the gap as illustrated in FIGS. 7B-E. As in the above example, the meniscus height can reach 45 nm. Increasing the cross-section of the outer meniscus 442 by three times can significantly reduce the capillary force. The applicant has found that reducing the capillary force also reduces the probability of leaking formable material out and forming extrusions on mesa sidewalls 240.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A process comprising:
    providing a template having:
        a single mesa with a patterning surface; and
        mesa sidewalls that surround the single mesa and the patterning surface, the mesa sidewalls connect the patterning surface with a recessed surface, wherein the recessed surface extends from the mesa sidewalls to edges of the template;
    providing a substrate having:
        a plurality of imprint fields, wherein edges of each of the plurality of imprint fields are defined by the mesa sidewalls of the single mesa;
        gaps between each of the plurality of imprint fields on the substrate; and
        a depressed region outside of the imprint fields, wherein edges of the imprint field coincide with the mesa sidewalls of the template on the substrate, and in a particular gap among the gaps between imprint fields, wherein the depressed region is formed in the particular gap along an edge of an imprint field of the substrate;

depositing formable material in the imprint field of the substrate; and moving the template, such that the template comes into contact with the formable material in the imprint field;

while the patterning surface of the single mesa is parallel to the substrate surface, a template side meniscus radius of curvature is less than a substrate side meniscus radius of curvature prior to a template contact line reaching a template boundary; and wherein while the template comes into contact with the formable material, the formable material flows into the depressed region outside of the imprint field in the particular gap.

2. The process according to claim 1, wherein the depressed region surrounds the imprint field.

3. The process according to claim 1, wherein forming the depressed region includes etching at least one trench into the substrate.

4. The process according to claim 3, wherein the trench is etched into the substrate to a depth that is a height of features previously created in the imprint field.

5. The process according to claim 3, wherein forming the depressed region includes coating both the trench and the imprint field with a film.

6. The process according to claim 5, wherein the film is spin coated on the substrate and then hardened.

7. The process according to claim 1, wherein the substrate is a wafer.

8. The process according to claim 1, wherein:

the formable material has an outer meniscus that moves towards the edge of the imprint field, while the template is in contact with the formable material;

the outer meniscus surrounds the formable material between the template and the substrate;

the outer meniscus is an interface between the formable material, a surrounding gas, and between the template and the substrate closest to the edge of the imprint field;

the outer meniscus has 1 dimensional curvature in the vertical direction between the template and substrate;

the template contact line is an intersection of the template and the outer meniscus;

a substrate contact line is an intersection of the substrate and the outer meniscus;

the template side meniscus radius of curvature is a radius of the meniscus in the direction towards the substrate at the template contact line, averaged across the template contact line; and the substrate side meniscus radius of curvature is a radius of the meniscus in the direction towards the template at the substrate contact line, averaged across the substrate contact line.

9. The process according to claim 1, further comprising: curing the formable material in the imprint field between the template and the substrate after the formable material has flowed into the depressed region.

10. The process according to claim 1, wherein a difference between the substrate side meniscus radius of curvature and the template side meniscus radius of curvature increases as the formable material drains into the depressed region outside of the imprint field in the gap.

11. The process according to claim 1, wherein the formable material does not form extrusions on the mesa sidewalls.

12. An apparatus comprising:

a template chuck configured to hold a template;

wherein the template has:

a single mesa with a patterning surface; and mesa sidewalls that surround the single mesa and the patterning surface, the mesa sidewalls connect the patterning surface with a recessed surface, wherein the recessed surface extends from the mesa sidewalls to edges of the template;

a substrate chuck holding a substrate;

wherein the substrate has:

a plurality of imprint fields, wherein edges of each of the plurality of imprint fields are defined by the mesa sidewalls of the template single mesa, gaps between each of the plurality of imprint fields on the substrate; and a depressed region outside of the imprint fields, wherein edges of the imprint field coincide with the mesa sidewalls of the template on the substrate in a particular gap among the gaps between imprint fields; and wherein the depressed region is formed in the particular gap along an edge of an imprint field of the substrate;

a fluid dispenser configured to deposit formable material in the imprint field of the substrate;

a positioning system configured to move the template chuck and the substrate chuck relative to each other, such that the template comes into contact with the formable material in the imprint field;

while the patterning surface of the single mesa is parallel to the substrate surface, a template side meniscus radius of curvature is less than a substrate side meniscus radius of curvature prior to a template contact line reaching a template boundary; and wherein while the single mesa comes into contact with the formable material, the formable material flows into the depressed region outside of the imprint field in the particular gap on the substrate.

13. The apparatus according to claim 12, wherein the depressed region surrounds the imprint field with the at least one depressed region.

14. The apparatus according to claim 12, wherein forming the depressed region includes etching at least one trench into the substrate.

15. The apparatus according to claim 14, wherein forming the depressed region includes coating both the trench and the imprint field with a film.

16. The apparatus according to claim 15, wherein the film is spin coated on the substrate and then hardened.

17. The apparatus according to claim 12, wherein the substrate is a wafer.

18. The apparatus according to claim 12, wherein:

the formable material has an outer meniscus that moves towards the edge of the imprint field, while the template is in contact with the formable material;

the outer meniscus surrounds the formable material between the template and the substrate;

the outer meniscus is an interface between the formable material, a surrounding gas, and between the template and the mesa closest to the edge of the imprint field;

the outer meniscus has 1 dimensional curvature in the vertical direction between the template and substrate;

the template contact line is an intersection of the template and the outer meniscus;

a substrate contact line is an intersection of the substrate and the outer meniscus;

the template side meniscus radius of curvature is a radius of the meniscus in the direction towards the substrate at the template contact line, averaged across the template contact line; and the substrate side meniscus radius of curvature is a radius of the meniscus in the direction towards the template at the substrate contact line, averaged across the substrate contact line.

19. The apparatus according to claim 12, further comprising:

a curing system configured to cure the formable material in the imprint field between the template and the substrate after the formable material has flowed into the depressed region.

20. A method of manufacturing an article comprising:

providing a template having:

a single mesa with a patterning surface; and mesa sidewalls that surround the single mesa and the patterning surface, the mesa sidewalls connect the patterning surface with a recessed surface, wherein the recessed surface extends from the mesa sidewalls to edges of the template;

providing a substrate having:

a plurality of imprint fields, wherein edges of each of the plurality of imprint fields are defined by the mesa sidewalls of the single mesa;

gaps between each of the plurality of imprint fields on the substrate; and a depressed region outside of the imprint fields, wherein edges of the imprint field coincide with the mesa sidewalls of the template on the substrate, and in a particular gap among the gaps between imprint fields, wherein the depressed region in the particular gap is formed along an edge of an imprint field of the substrate;

depositing formable material in the imprint field of the substrate; and moving the template, such that the template comes into contact with the formable material in the imprint field of the substrate;

while the patterning surface of the single mesa is parallel to the substrate surface, a template side meniscus radius of curvature is less than a substrate side meniscus radius of curvature prior to a template contact line reaching a template boundary; and wherein while the template comes into contact with the formable material, the formable material flows into the depressed region outside of the imprint field in the particular gap; and perform additional processing on the substrate so as to manufacture the article.

* * * * *